(12) United States Patent
Formwalt, Jr. et al.

(10) Patent No.: US 6,655,017 B1
(45) Date of Patent: Dec. 2, 2003

(54) ELECTRONIC CONTROLLER UNIT AND METHOD OF MANUFACTURING SAME

(75) Inventors: Charles William Formwalt, Jr., Janesville, IA (US); James Edward Sabelka, Denver, IA (US); David Alan Larson, Cedar Falls, IA (US); Vijay Manilal Dharia, Cedar Falls, IA (US)

(73) Assignee: Deere & Company, Moline, IL (US)

( * ) Notice: Subject to any disclaimer, the term of this patent is extended or adjusted under 35 U.S.C. 154(b) by 0 days.

(21) Appl. No.: 09/563,692

(22) Filed: May 3, 2000

(51) Int. Cl.$^7$ ................................................ H05K 3/30
(52) U.S. Cl. ..................... 29/832; 29/830; 29/840; 29/564.6; 438/121; 361/728; 361/736; 439/67; 439/76.1
(58) Field of Search .......................... 29/830, 832, 835, 29/836, 839, 840, 827, 564.3, 564.6; 83/929.1, 929.2; 438/111, 121, 122, 123, FOR 366, FOR 380, FOR 381; 361/736, 737, 728; 439/67, 76.1, 493

(56) References Cited

U.S. PATENT DOCUMENTS 5,093,985 A * 3/1992 Houldsworth et al. ........ 29/830
5,159,751 A    11/1992 Cottimgham et al. ......... 29/832
5,265,322 A    11/1993 Fisher et al. .................. 29/848
5,434,362 A     7/1995 Klosowiak et al. ......... 174/254
5,998,738 A * 12/1999 Li et al. ...................... 174/250

FOREIGN PATENT DOCUMENTS

WO    WO 90/06609    *  6/1990    ............ H02B/1/00

* cited by examiner

Primary Examiner—Rick K. Chang

(57) ABSTRACT

An electronic controller unit is formed of first and second base plates parallel to one another and spaced apart having a flexible substrate circuit board thereon with an intermediate portion of the circuit board extending between the two base plates. A connector is joined to the intermediate portion of the circuit board between the two base plates and is sealed to an edge of each base plate to form one side of the unit housing. A three-sided frame is joined to the other three sides of the two base plates to completely enclose the circuit board. The two major sides of the unit are formed by separate base plate pieces that are severed from an integral frame after the flexible circuit is bonded thereto. This allows the unit to be manufactured without bending of a rigid plate having the flexible circuit mounted thereto.

4 Claims, 4 Drawing Sheets

ELECTRONIC CONTROLLER UNIT AND METHOD OF MANUFACTURING SAME

BACKGROUND OF THE INVENTION

1. Field of the Invention

The present invention relates to a electronic controller unit having a flexible circuit board in which a connector forms a wall of the unit housing and to a method of manufacturing the electronic controller unit that does not require bending of a rigid plate to which the flexible circuit board is mounted.

2. Description of the Related Art

Sealed electronic controller units having an enclosed flexible circuit board are known as shown by U.S. Pat. Nos. 5,159,751 and 5,434,362. The flexible circuit board is mounted to a rigid aluminum plate that is subsequently bent to form the housing of the unit. As shown in U.S. Pat. No. 5,434,362 the aluminum plate is bent along numerous lines to form the six sides of the unit housing. In U.S. Pat. No. 5,159,751, the aluminum plate is bent with a single large radius bend to form three sides of the housing while a three sided enclosure portion 29 forms the remaining sides of the housing. The connectors 24 and 25 are electrically connected to the flexible circuit and are sealed to the enclosure portion 29. As explained in the above-mentioned patents, care must be taken in bending the aluminum plate to avoid damage to the circuit board and the electrical components mounted thereon.

SUMMARY OF THE INVENTION

The present invention seeks to overcome the difficulties in bending the plate carrying the circuit board by a novel structure of the electronic controller unit that eliminates the bending of the plate and a unique method of manufacturing the electronic controller unit.

The electronic controller unit of the present invention includes first and second base plates that during the initial steps of the manufacturing process are held in a fixed position relative to one another in which they are coplanar and spaced apart. Typically, the base plates are made of aluminum and are held in place by an integral frame consisting of a pair of side rails. A flexible circuit is bonded to one side of the base plates and has an intermediate portion that spans between the two base plates. The electrical components are mounted on the flexible circuit and are electrically connected thereto. A connector is placed on the opposite side of the flexible circuit from the electrical components, between the two base plates, and is also electrically connected to the flexible circuit.

The integral side rails holding the base plates in place are subsequently removed, allowing the two base plates to be moved relative to one another. The circuit is flexed in two locations, one on each side of the connector, as the two base plates are moved to a spaced, parallel relationship to one another. The connector is subsequently sealed to the base plates along one edge of the each base plate with the connector forming one wall of the unit housing while the base plates form opposite major faces of the unit housing. A frame forms the remaining three sides of the unit housing between the two base plates and is also sealed to the base plates and to the connector. The unit housing thus utilizes the connector as one wall thereof. Since the unit is manufactured with the flexible circuit bonded to two separate base plates, there is no need to bend an aluminum plate or other rigid material.

DESCRIPTION OF THE PREFERRED EMBODIMENT

The electronic controller unit of the present invention is shown in the Figures and designated generally at 10. The unit 10 forms a three dimensional body having six sides as follows: First and second parallel base plates 12 and 14 form major sides of the unit body. A connector 16 forms another side and is secured to one edge of the first and second base plates 12, 14. A frame 22 forms the remaining three sides of the unit body and is joined to the other three edges of the first and second base plates and also to the connector 16. The first and second base plates, connector and frame are sealed together to form a housing to enclose a flexible circuit as described below.

Figure 2:
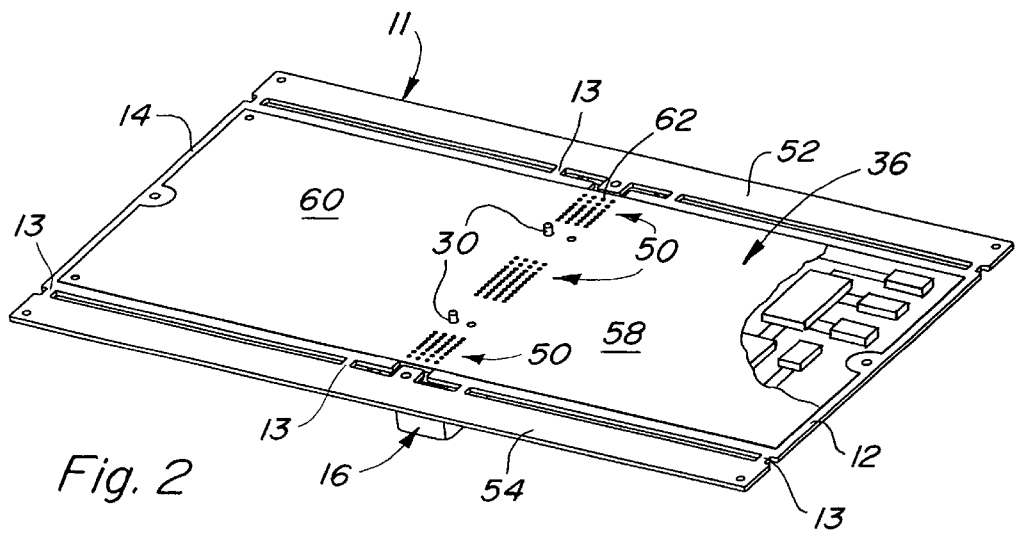
FIG. 2 is a perspective view of a partially assembled electronic controller unit of the present invention.

The unit is constructed by providing plate stock 11 having first and second base plates 12, 14. The plate stock includes side rails 52, 54 forming an integral frame for the base plates. The plate stock 11 is a single piece that is punched, stamped or otherwise worked to form a variety of openings to define the base plates and side rails. The side rails are connected to the base plates by bridges 13. The base plates 12, 14 are held by the side rails 52, 54 (FIG. 2) in fixed positions relative to one another in which the base plates are coplanar and spaced apart. A flexible circuit 36 is laminated to the base plates with pressure sensitive adhesive. A first portion 58 of the flexible circuit 36 is bonded to the inner surface of the first base plate 12 while a second portion 60 of the flexible circuit 36 is bonded to the inner surface of the second base plate 14. An intermediate portion 62 of the flexible circuit 36, between the two base plates 12 and 14, is coupled to the connector 16 as described below. Bridge portions 66 of the flexible circuit (best shown in FIGS. 4 and 6) span between the first portion 58 and the intermediate portion 62 and between the second portion 60 and the intermediate portion 62.

A 2 mm spacer 46 (FIG. 4) is bonded to the flexible circuit in the intermediate portion adjacent the connector 16. The spacer 46 stiffens the flexible circuit for insertion of the connector 16 and provides strain relief for the outer rows of the connector pins 70 shown in FIG. 6. The spacer is adhered to the flexible circuit with pressure sensitive adhesive and can be any stiff non-conducting material including plastic, or the substrate of a rigid, printed circuit board. The connector 16 also includes locator pins 30 that position the connector relative to the flexible circuit 36.

The flexible circuit 36 is made of a flexible substrate that carries an electrically conductive circuit pattern. Various electrical components 40 (FIG. 2) are mounted to the flexible circuit by soldering to the circuit pattern using a convection re-flow oven in a known manner.

Figure 4:
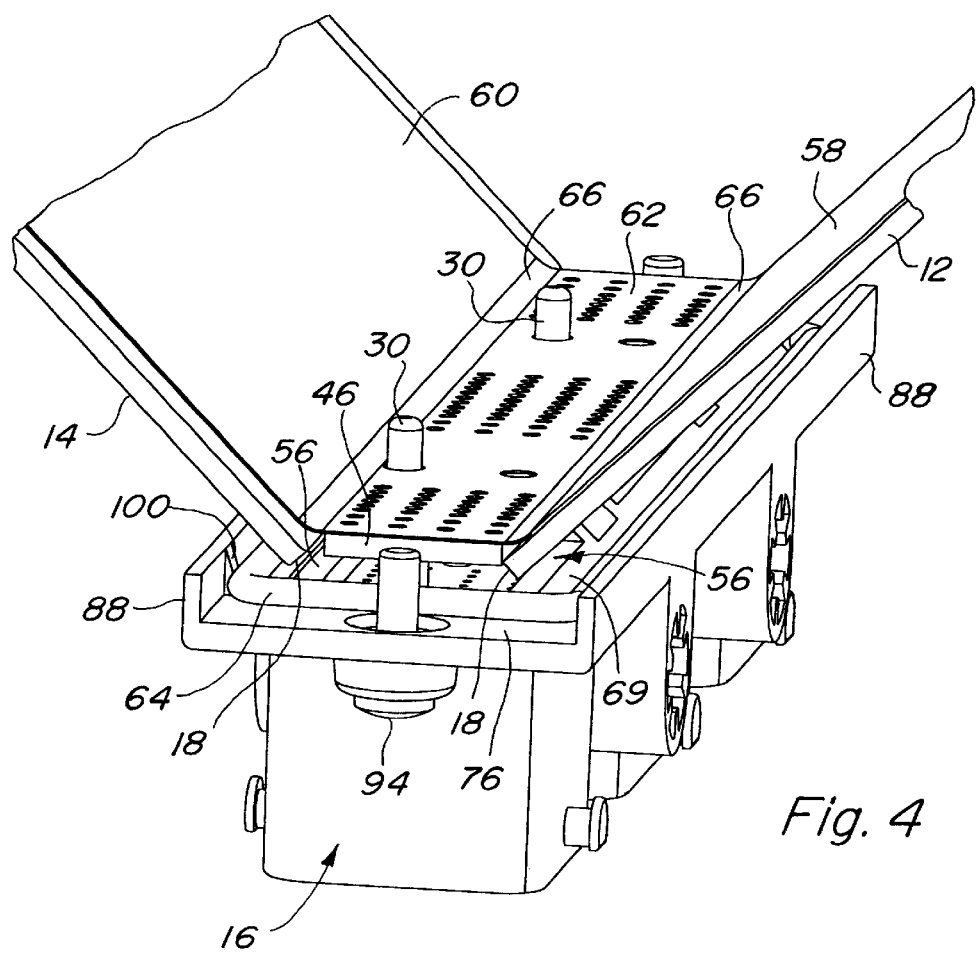
FIG. 4 is a perspective view of a partially assembled electronic controller unit of the present invention with the base plates moved from initial positions shown in FIGS. 2 and 3 and with a bead of sealant applied.
Figure 6:
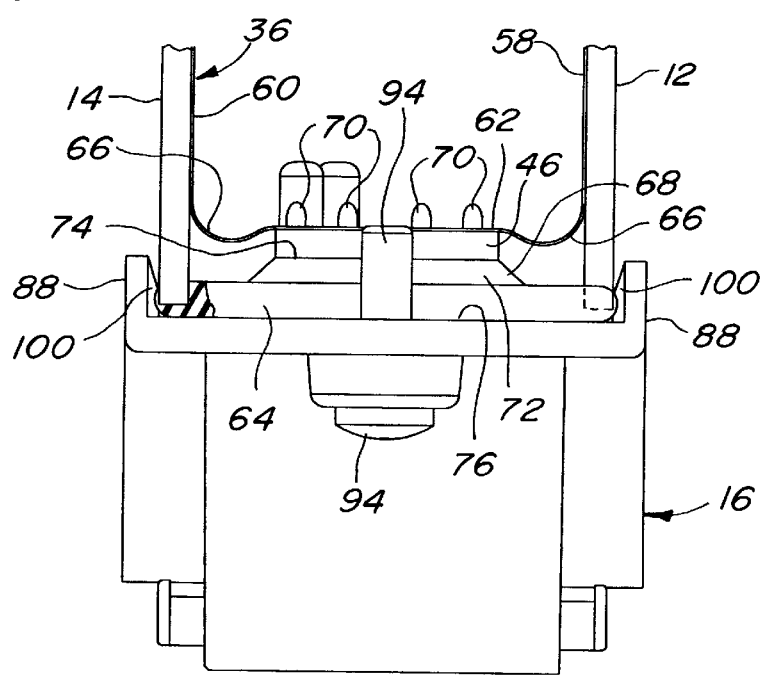
FIG. 6 is a side view of the assembled electronic controller unit of the present invention with the frame removed to illustrate the internal components.

With reference to FIGS. 4 and 6, the connector 16 has a plurality of pins 70 that extend through ferrite blocks 72, the spacer 46 and the flexible circuit 36. The pins 70 and ferrite blocks 72 are shown only in FIG. 6. The pins 70 are soldered to the circuitry pattern of the flexible circuit in the intermediate portion 62 thereof. The ferrite block or blocks form an internal coupling surface 74 of the connector that is normal to the base plates as shown in FIG. 6. The width of the coupling surface is less than the width of the ECU body defined by the spacing between the first and second base plates in the assembled position shown in FIG. 6. The coupling surface 74 is raised above the inner surface 76 of the connector body. The FR4 spacer 46 at the intermediate portion of the flexible circuit engages the coupling surface 74 formed by the ferrite block. If a spacer 46 is not used, the substrate of the flexible circuit will directly engage the coupling surface 74 of the connector as defined by the ferrite blocks.

Three ferrite blocks are used; one for each section 50 of pins 70 between the locator pins 30. The ferrite blocks 72 are positioned between a pair of raised ribs 56 extending from the connector inner surface 76. The ferrite blocks and the ribs 56 have tapered outer edges 68, 69 (shown in FIGS. 4 and 6) to allow the base plates to be moved from the coplanar to the parallel positions as described.

Figure 3:
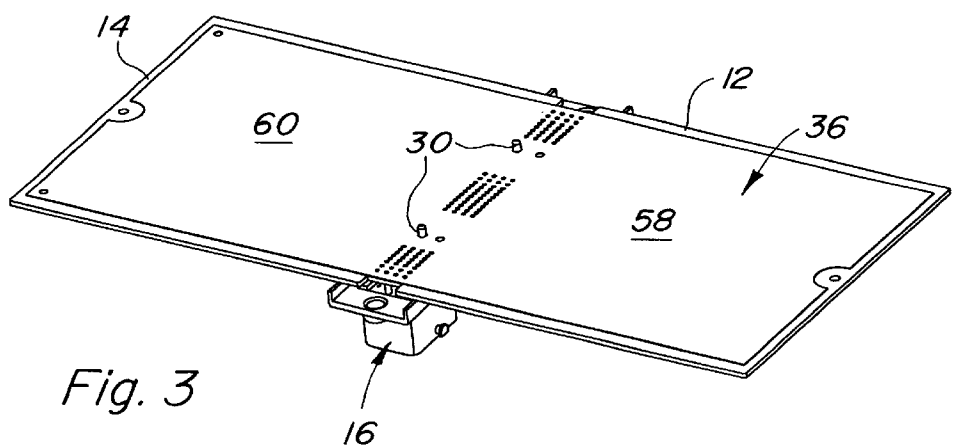
FIG. 3 is a perspective view of a partially assembled electronic controller unit of the present invention at a subsequent stage of assembly.
Figure 5:
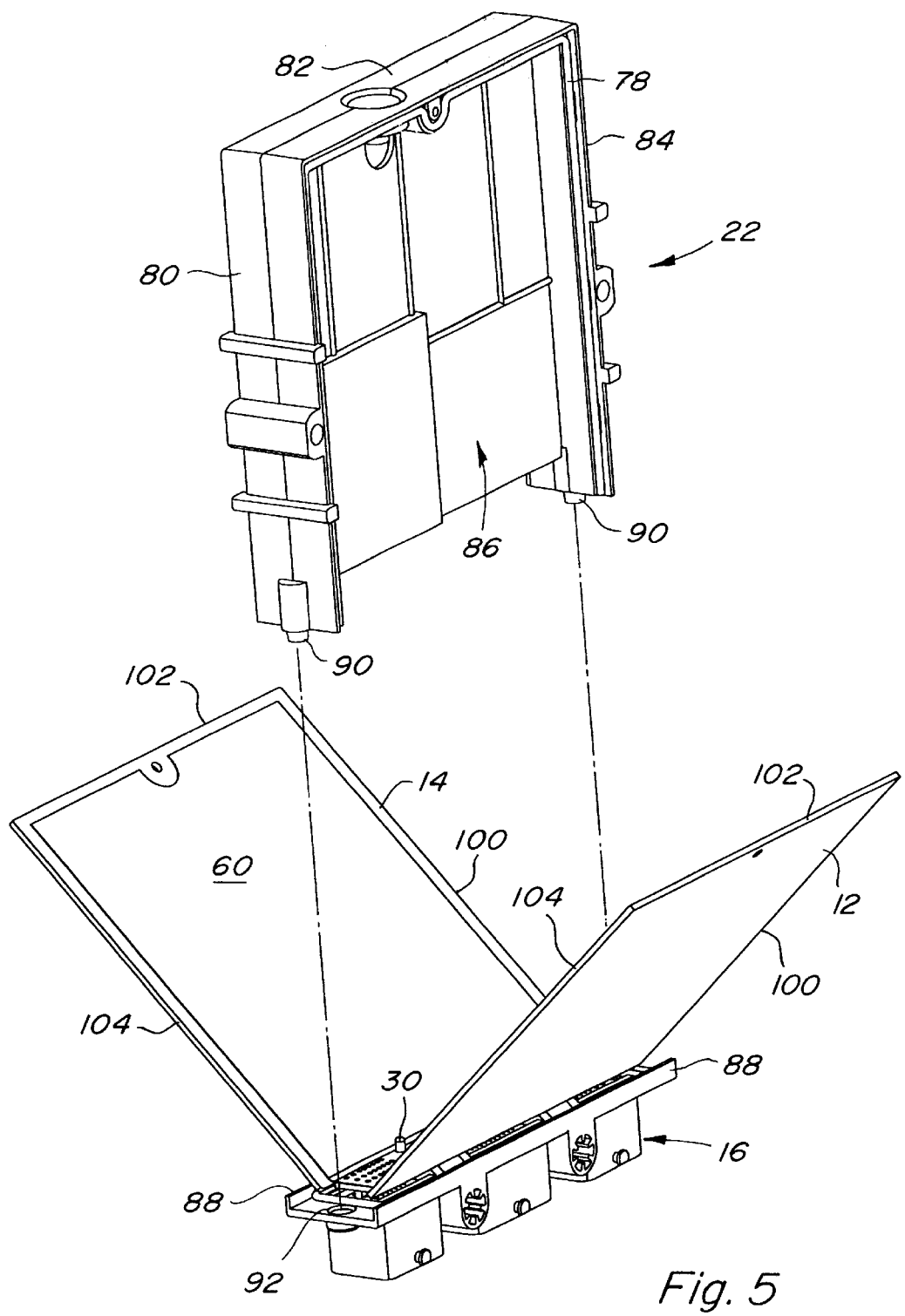
FIG. 5 is an exploded perspective view of the electronic controller unit of the present invention shown in an intermediate stage of assembly including the unit frame.

The side rails 52, 54 are removed from the base plates by a beveled shear after the connector 16 has been griped to hold it in place and the two base plates have been attached to movable vacuum fixtures. The assembly, with the side rails removed, is shown in FIG. 3. Once the side rails have been removed, the first and second base plates are moved to approximately 45° positions shown in FIGS. 4 and 5. The base plates are positioned with their lower edges 18 moved inward somewhat. This allows clearance for a bead of RTV silicon sealant 64 to be applied to the connector 16. A bead of sealant 78 is also applied to the frame 22 held above the connector 16 as shown in FIG. 5. The frame forms three sides 80, 82 and 84 of the housing. The frame is recessed along the edges of the sides to form a seat for the sealant 78 and the base plates 12 and 14. The sealant 78 seals outer edges 100, 102, and 104 of the base plates 12 and 14 to the frame 22. A center wall 86 forms a divider between the two base plates and the electrical components 40.

The base plates are moved outward and to the top of the connector upright sidewalls 88 as the frame is lowered to the connector. This avoids smearing of the sealant beads. The base plates are seated into the frame first. The frame and base plates are then seated onto the connector by moving the base plates downward inside the upright sidewalls 88. The sidewalls 88 have inwardly projecting ribs 100 that space the base plates from the sidewalls 88. This produces a gap for the sealant 64. The base plates, in the final assembled position, are spaced from the connector inner surface 76 to provide a gap for the sealant at the bottom of the base plates. By spacing the base plates from the sidewalls 88 and the inner surface 76, the sealant is not squeezed out, but is allowed to completely cover the edge of the base plates.

Figure 1:
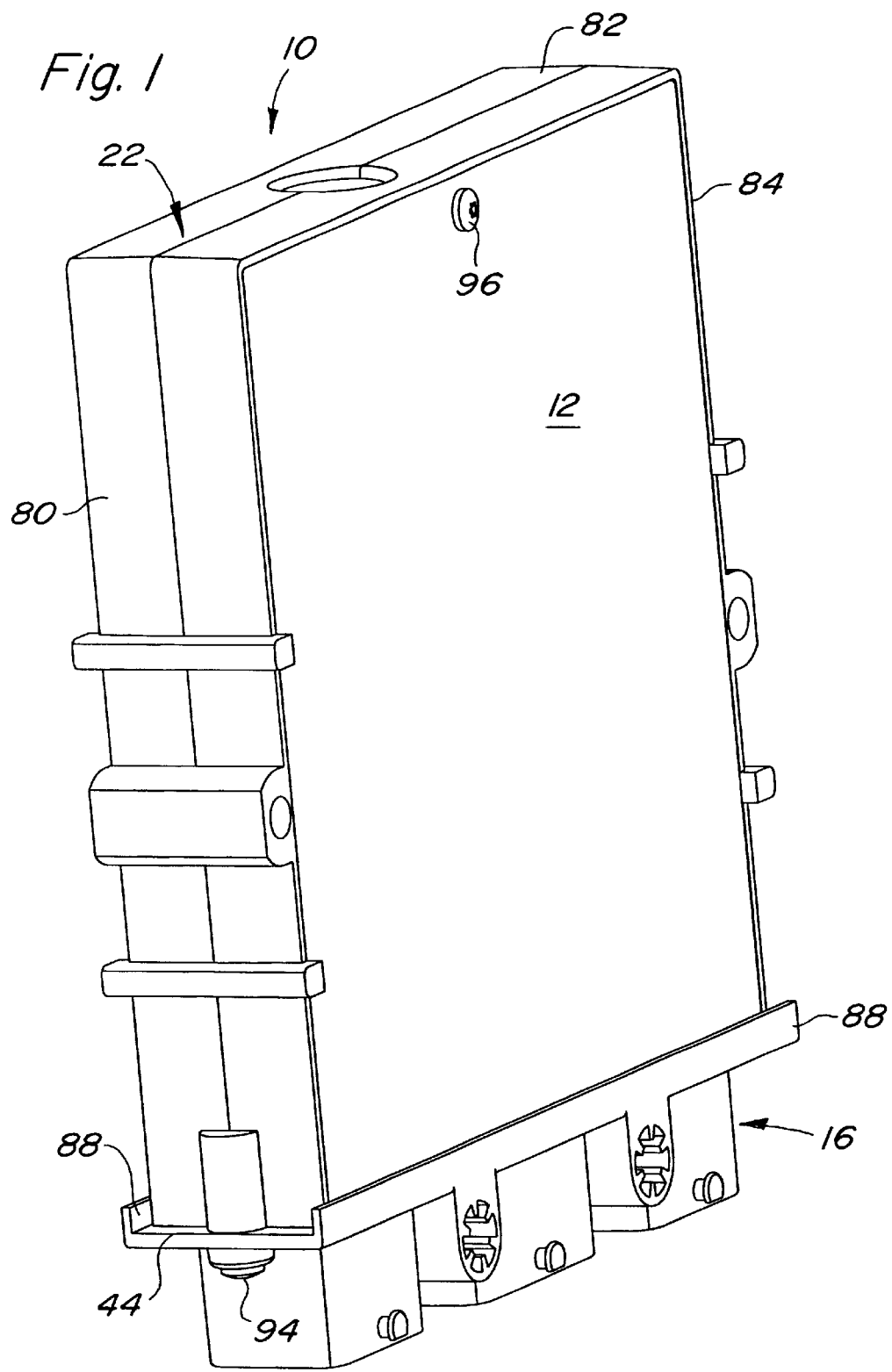
FIG. 1 is a perspective view of the electronic controller unit of the present invention.

The lower end of the frame has a pair of conical shaped alignment pins 90 that are inserted into complementary apertures 92 in the connector 16 as the frame is lowered onto the connector. Fasteners 94 are inserted upward through the apertures in the connector and into the pin 90 in the frame. A screw 96 also attaches each base plate to the frame as shown in FIG. 1.

In an alternative embodiment, the connector upright sidewalls 88 may wrap around the two ends of the connector, as well as along the sides, to protect the frame-to-connector joint on each side.

Once assembled, the bridge portions 66 of the flexible circuit 36 bend downward from the spacer 46 and then bend upward to the base plates 12 and 14 as shown in FIG. 6. This bend configuration results in the flexible circuit pressing against the base plates at the lower end. This prevents de-lamination of the flexible circuit from the base plates that occurs in some electronic control units of prior designs where the bends in the flexible circuit caused the flexible circuit to be pulled away from the base plates.

The electronic controller unit of the present invention utilizes the connector as one side of the unit housing, thereby avoiding the need to provide other side structure or to bend a base plate to form a portion of the housing around the connector. The structure of the unit does not require bending of a rigid plate to form the housing thereby eliminating the complications involved in bending the rigid plate carrying the flexible substrate. As a result, the allowable bending radius of the base plate material does not control the thickness of the unit. The base plates are typically made of aluminum for good heat transfer to cool the electrical components on the circuit board. Other materials can be used that provide rigid support for the circuit board. With the present invention, since the base plates are not bent, the bending characteristics of the material are not relevant. The method of manufacturing also results in the flexible circuit being pressed toward, rather than pulled away from, the base plates.

The invention has been shown in which an integral frame holds the base plates in fixed positions as the flexible circuit is bonded to the base plates. The integral frame is later removed. It may also be possible to begin with separate base plates that are held in a tooling fixture for lamination of the flexible circuit and other steps until it is desired to the move the base plates into position.

The invention should not be limited to the above-described embodiment, but should be limited solely by the claims that follow.

We claim:

1. A method for manufacturing an electronic controller unit comprising the steps of:
   providing a single piece plate stock having first and second base plates and connecting portions holding the first and second base plates in initial positions fixed relative to one another;
   providing a flexible circuit having a first portion, a second portion and an intermediate portion therebetween, and bonding the first and second portions of the flexible circuit to the first and second base plates respectively with the intermediate portion of the flexible circuit extending between the first and second base plates;
   providing and mounting a plurality of electrical components to the flexible circuit;
   providing and placing a connector on the intermediate portion of the flexible circuit on a side thereof opposite from the electrical components;
   subsequently removing the connecting portions of the plate stock and moving the base plates from the initial positions to second positions while bending the flexible circuit between the first and intermediate portions and between the second and intermediate portions.

2. The method for manufacturing the electronic controller unit as defined by claim 1 wherein in the initial positions, the base plates are spaced apart from one another and coplanar with one another and in the final positions the first and second base plates are parallel and spaced from one another.

3. The method for manufacturing the electronic controller unit as defined by claim 1 further comprising steps of:

sealing one edge of the first and second base plates to the connector;

providing a frame having three sides with each side extending along outer edges of the first and second base plates forming walls extending therebetween;

sealing the frame to the outer edges of the first and second base plates; and sealing the connector to the frame.

4. The method for manufacturing the electronic controller unit as defined by claim 3 further comprising mechanically fastening the frame to the connector and mechanically fastening the frame to the first and second base plates.

* * * * *